United States Patent
Klein

(10) Patent No.: US 7,146,581 B2
(45) Date of Patent: Dec. 5, 2006

(54) AUTOMATED REPARTITIONING OF HARDWARE AND SOFTWARE COMPONENTS IN AN EMBEDDED SYSTEM

(76) Inventor: Russell Alan Klein, 2075 Alpine Dr., West Linn, OR (US) 97068

( * ) Notice: Subject to any disclaimer, the term of this patent is extended or adjusted under 35 U.S.C. 154(b) by 0 days.

(21) Appl. No.: 10/295,538

(22) Filed: Nov. 15, 2002

(65) Prior Publication Data
US 2004/0098701 A1    May 20, 2004

(51) Int. Cl.
*G06F 17/50* (2006.01)
(52) U.S. Cl. .............................. 716/2; 716/18; 703/22
(58) Field of Classification Search ................ 716/1, 716/2, 18; 703/13–17, 21–22, 28; 714/32–33
See application file for complete search history.

(56) References Cited

U.S. PATENT DOCUMENTS

| | | | |
|---|---|---|---|
| 5,493,672 A * | 2/1996 | Lau et al. ....................... 703/21 |
| 5,598,344 A * | 1/1997 | Dangelo et al. ............... 716/18 |
| 5,768,567 A * | 6/1998 | Klein et al. .................... 703/13 |
| 5,771,370 A | 6/1998 | Klein |
| 5,815,206 A | 9/1998 | Malladi et al. |
| 5,838,948 A * | 11/1998 | Bunza ........................... 703/27 |
| 5,841,967 A * | 11/1998 | Sample et al. ................. 714/33 |
| 5,870,588 A | 2/1999 | Rompaey et al. |
| 5,937,184 A | 8/1999 | Rao |
| 6,006,022 A * | 12/1999 | Rhim et al. .................... 716/1 |
| 6,009,256 A | 12/1999 | Tseng et al. |
| 6,035,123 A * | 3/2000 | Razdan et al. ............... 717/155 |
| 6,112,023 A | 8/2000 | Dave et al. |
| 6,188,975 B1 * | 2/2001 | Gay .............................. 703/22 |
| 6,212,489 B1 | 4/2001 | Klein et al. |
| 6,230,303 B1 | 5/2001 | Dave |
| 6,272,451 B1 | 8/2001 | Mason et al. |
| 6,289,488 B1 | 9/2001 | Dave et al. |
| 6,356,862 B1 * | 3/2002 | Bailey .......................... 703/16 |
| 6,389,379 B1 * | 5/2002 | Lin et al. ...................... 703/14 |
| 6,415,384 B1 | 7/2002 | Dave |
| 6,550,042 B1 | 4/2003 | Dave |
| 6,584,436 B1 | 6/2003 | Hellestrand et al. |
| 6,622,287 B1 | 9/2003 | Henkel |
| 2001/0011210 A1 * | 8/2001 | Bailey .......................... 703/17 |

OTHER PUBLICATIONS

Carreras et al., "A co-design Methodology Based on Formal Specification and High Level Estimation", IEEE 1996, pp. 28-35.

Harkin et al., "Accelerating Embedded Applications using Dynamically Reconfigurable Hardware and Evolutionary Algorithms", 2000 IEEE, pp. 321-322.

(Continued)

*Primary Examiner*—Thuan Do
*Assistant Examiner*—Naum B. Levin
(74) *Attorney, Agent, or Firm*—Klarquist Sparkman, LLP

(57) ABSTRACT

A hardware-software system design optimization tool is described. The tool allows a designer to optimize the system performance by allowing him to select software components of the system and move them to a hardware representation. The software components are selected by using a performance profile of the system, which comprises time data related to execution of the software components, memory and bus transactions. In another aspect, the tool automatically collects the performance data and generates the performance profile. In another aspect, performance data is collected by modeling the execution of the hardware-software system. In another aspect, hardware-software system is modeled again after selected software components are moved to a hardware representation to inquire whether the move improved overall system performance.

39 Claims, 16 Drawing Sheets

OTHER PUBLICATIONS

Nascimento et al., "A Repartitioning and HW/SW Partitioning Algorithm of the Automatic Design Space Exploration In the Co-Synthesis of Embedded Systems", IEEE Jun. 2001, pp. 85-90.

Stoy et al., "An Integrated Modelling Technique for Hardware/Software Systems", 1994 IEEE International Symposium, vol. 1, pp. 399-402.

Stoy et al., Repartitioning for Hardware/Software Co-Synthesis, IEEE 1997, pp. 170-175.

Toporkov, "Performance-Complexity Analysis in Hardware-Software Codesign for Real-Time Systems", 1995 IEEE, pp. 340-345.

* cited by examiner

FIG. 8

| TIME (803) | TYPE (810) | FROM (815) | TO (820) | ATTRIBUTES |
|---|---|---|---|---|
| 10 | MEMORY | MEM ADD 1 | MEM ADD 2 | MEM READ |
| 15 | MEMORY | MRM ADD 3 | MEM ADD 4 | MEM WRITE |
| 19 | ENTRY | MAIN | MAIN+4 | INVOCATION 1 |
| 21 | BRANCH | MAIN +10 | MAIN+12 | |
| 32 | EXIT | MAIN + 2 | ALT | INVOCATION 2 |
| ... | | | | |
| 132 | BUS | BUS ADD 1 | BUS ADD 2 | BUS INFO |
| ... | | | | |
| 142 | MEMORY | MEM ADD 5 | 821 | 822 |
| 164 | BUS | | | |
| 166 (825) | ENTRY | 123 | 1000 | INVOCATION 3 |
| ... | | | | |
| 174 (830) | BRANCH | FOO+144 | FOO+96 | |
| 178 (833) | BRANCH | FOO+144 | FOO+96 | |
| 182 (840) | BRANCH | FOO+144 | FOO+96 | |
| .... | | | | |
| 206 (845) | EXIT | FOO+96 | 127 | INVOCATION 4 |
| ... | | | | 823 |
| 324 | BUS | | | |
| ... | | | | |
| 442 | MEMORY | | | |
| ... | | | | |
| 500 | MEMORY | | | |

| SOFTWARE COMPONENTS (910) | EXECUTION TIME (920) | PERCENTAGE OF TOTAL EXECUTION TIME (930) |
|---|---|---|
| FOO | 106 | 53% |
| FOO BAR | 50 | 25% |
| ALB | 30 | 15% |

900

AUTOMATED REPARTITIONING OF HARDWARE AND SOFTWARE COMPONENTS IN AN EMBEDDED SYSTEM

TECHNICAL FIELD

The technical field relates to electronic system design and more particularly relates to optimizing system design by repartitioning hardware and software components.

BACKGROUND

Many electronic systems being designed today are embedded systems, which generally consist of both software and hardware components. Such embedded systems are found in a wide variety of applications, such as cellular phones, microwave ovens, automobiles, etc. As with any system, designers of an embedded system strive to obtain better performance by attempting to increase the processing speed of the system as a whole, while trying to reduce the cost and power consumption associated with the hardware components.

One factor that impacts the performance of an embedded system is whether a given function of the system is implemented as hardware or software. Implementing a particular function in software provides flexibility because software is easily modifiable, whereas it is usually cost prohibitive to change hardware components. On the other hand, implementing a function in hardware is generally faster than software. Hardware implementation may also reduce the demand on the processors executing the software and speed up software execution. Furthermore, by implementing a function in hardware, a designer may be able to use smaller, less powerful processors, which reduces the cost of the system as a whole. These are some of the competing goals a designer needs to balance in arriving at an optimal design.

In order to optimize a system design, the designer may need to move software components into hardware to improve system performance. Such a process may have to be repeated several times until an optimal design is found. Unfortunately, this process is time consuming and cost prohibitive.

Until recently, software and hardware components could not even be tested or verified to see if they functioned together. Hardware emulators or simulators were used to verify the hardware design and the software components were tested separately using a compiler, debugger and other software testing tools. Currently, tools are available for co-verification of software and hardware components of an embedded system. One such system is described in U.S. Pat. No. 5,771,370 (hereafter "the '370 patent") to Klein. Designers may now use such co-verification tools to simultaneously verify that the hardware and software components of a system function together to yield the desired results.

Even with the use of such co-verification tools, the design of the software and hardware components may still occur separately and independent of each other. Co-verification tools are limited to verifying that a completely designed system performs its intended functions. Such systems do not currently have the capability to inform the designers about other performance factors such as, which software functions may use the most processor capacity, perform the most memory accesses, or use the bus most often. Such information can aid a designer in deciding whether to implement a given functionality of the system in software or hardware. Some software profiling systems (e.g. Microsoft® Visual Studio® and Rational® Purify®) have the capability to provide a profile of a software execution that may pinpoint which of the various functions implemented in the software require the most processor time. However, such systems cannot account for the processor's transactions with the other hardware components in the system, such as bus contention and bus utilization.

Therefore, there is a need for a tool that will generate a performance profile of an embedded system that accounts for processor transactions related to both the hardware and software components of the system. There is further need for a tool that can selectively repartition software to hardware to improve system performance.

SUMMARY

As described herein, a tool is provided that allows designers to optimize the performance of a system by selectively moving functions from software to hardware. Additionally, the tool may evaluate the system for any performance gains. The designers can select the various software functions and evaluate the impact (on the performance of the system) of implementing the selected software function in hardware. This will allow the designers to quickly arrive at an optimal design for the hardware-software system by determining an optimal partition of the system between its hardware and software components.

In one aspect, a designer can model repartitioning hardware-software systems by removing selected components from software and replacing them with new hardware components and modified software components adapted to achieve the same functionality as the original system. The new hardware components are created by first generating a design of the hardware components in synthesizable HDL (Hardware Description Language). The HDL description of the new hardware components may then be used to verify that the repartitioned system achieves the same functionality as the original system. The modified software components correspond to the removed components and are automatically generated and adapted to provide inputs to and receive outputs from the newly generated hardware components.

In another aspect, the tool may automatically generate hardware bus interfaces adapted for the newly generated hardware components to communicate effectively with the rest of the components of the hardware-software system.

In yet another aspect, the tool may create performance profiles of the existing system and use the profile for selecting software components to be modeled as hardware components. The profiles are adapted to provide performance data related to utilization of one or more processors running the software. The profile data is used to determine which of the software functions place the greatest demands on the processors' capacity and select such functions to be implemented in hardware instead. The designers can generate the performance profile again for a system once the system is repartitioned and analyze the profile data to determine the potential impact of moving a selected function from a software implementation to a hardware implementation. If the designers are dissatisfied with the performance, they can select more or different software functions to be moved to a hardware implementation and repeat the process until an optimal design is reached.

In another aspect, the performance profile is also adapted to provide data related to referencing of the memory elements of the system and utilization of the various buses associated with executing the software before and after its repartitioning. Such data can be used in addition to the processor speed and utilization data for arriving at an optimal design for the system.

In a final aspect, all of the various features and capabilities of the system mentioned above are done automatically allowing the designers to shorten the design cycles of their products.

These and other aspects will become apparent from the following detailed description, which makes references to the accompanying drawings.

BRIEF DESCRIPTION OF THE DRAWINGS

FIG. 8 is an exemplary time log corresponding to the execution of the hardware-software system used for generating the performance of the system.

FIG. 9 is an exemplary table containing a summary of the time data from the time log of FIG. 8, related to the execution of the instructions of the various software components for generating a performance profile.

DETAILED DESCRIPTION

Overview

In a hardware-software system having both hardware and software components, deciding whether to implement a given function of the system as software or as hardware can impact the system's overall performance. In order to arrive at a optimal system design, a designer may need to select functions originally implemented in software and move them to hardware to improve system performance. This is commonly referred to as "repartitioning" a hardware-software system. However, to achieve design optimization through repartitioning may be time consuming without the aid of automation. A designer may use the methods and systems described below to automatically optimize system performance by evaluating and analyzing the performance of the original system and repartitioning the system when desired.

Exemplary Hardware-software System

Figure 1:
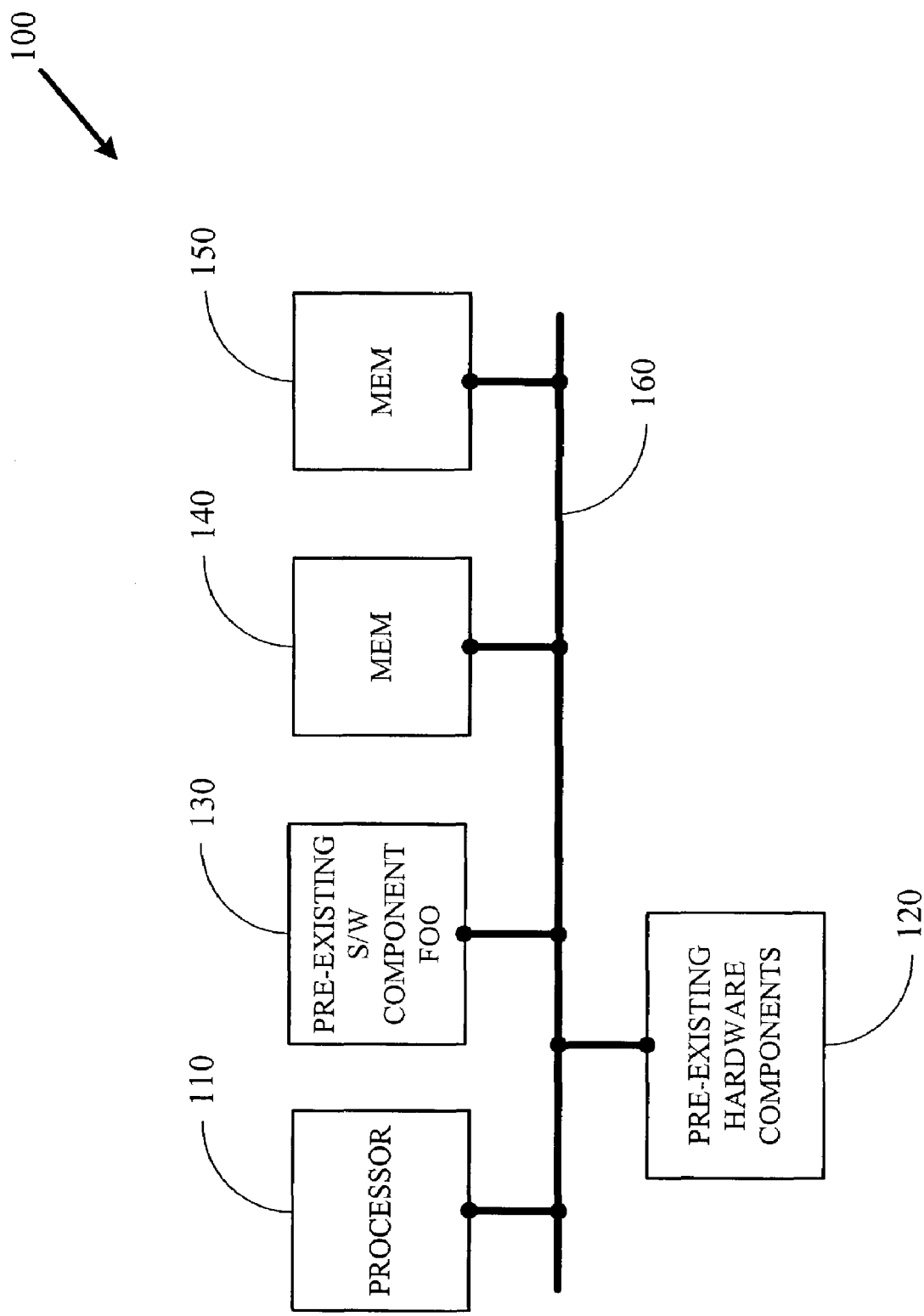
FIG. 1 is a block diagram of an exemplary hardware-software system prior to conversion of selected software components to hardware components.

FIG. 1 shows an exemplary hardware-software system 100 comprising both software components and hardware components adapted to function together to implement the desired functionality of the system. The system 100 comprises a processor instance 110 (e.g. Intel® Pentium®4, a RISC processor, etc.). The processor instance 110 may be adapted to receive and execute instructions from software programs, such as the pre-existing software component FOO 130. Thus, a part of the functionality of the system may be implemented in the form of software programs. The rest of the functionality of the system may be implemented in the form of hardware logic components 120. The system may include one or more memory elements, such as memories 140, 150. One or more system buses 160 may be provided for the various components to communicate with each other. Communication means other than system buses 160 (e.g. a network of buses, a point-to-point network, etc.) may also be used to connect the components together.

Although FIG. 1 shows just one processor instance 110, it is possible for a hardware-software system to have multiple processors of various types for handling multiple functions. Furthermore, FOO is only an example of a software component of a hardware-software system. Software components other than FOO 130 may also be stored at memory elements 140 and 150. The other software components may include operating system components and other software necessary to implement the system functionality. The memory elements 140 and 150 may be a wide variety of memory types, such as static RAM's (Random Access Memory), dynamic RAM's, hard disc drives, etc. These memory elements may also be accessed by the hardware components 120 for processing (e.g. receiving input data or storing output data). Additionally, the processors 10 may also access data or instructions from other sources outside of the system 100 for implementing some or all of the desired system functionality.

The hardware components 120 may include off-the-shelf gate level logic, custom hardware (e.g. PLD's (Programmable Logic Devices)), or ASIC's (Application Specific Integrated Circuit). Although the processor instance 110 is shown separately in FIG. 1, it may also be integrated into the other hardware components. Similarly, memory elements 140 and 150 too may be integrated into the hardware components. However, unless otherwise specified, all references to hardware components hereafter should be assumed to refer to those hardware components implementing the functionality of the system that is not implemented using software components.

To optimize the design of system 100, a designer may have to select some functions of the system to be initially implemented as software components 130 and the rest as hardware components 120. It is also possible that the functionality of the system may be initially implemented entirely in software. If the performance is unsatisfactory, some of the functionality originally implemented as software components 120 may be converted to hardware components 130 to speed system performance.

Exemplary Method for Optimizing the Performance of the Hardware-software System

Figure 2:
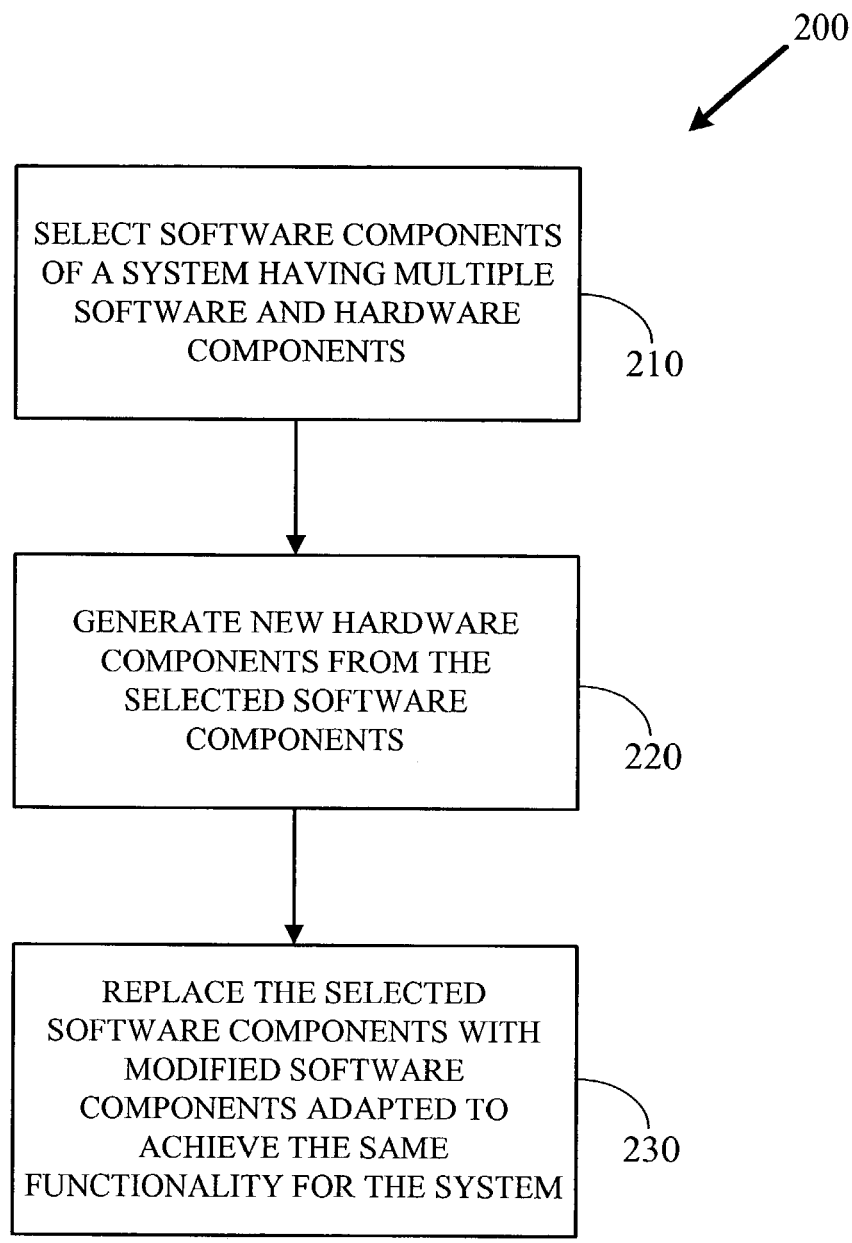
FIG. 2 is a flow chart of an exemplary method for optimizing the performance of a hardware-software system by selectively converting software components of the system into hardware components.

FIG. 2 illustrates an exemplary method 200 for optimizing the performance of a hardware-software system, such as the one shown in FIG. 1. At 210 one or more of components of software implementing various functions of the system are selected. As described further below, the selected software components are generally those components that use a significant amount of system resources. At 220 new hardware components are generated from the selected software components. Software components of various levels of complexity corresponding to various levels of system functionality may be selected for conversion to hardware. Entire software programs handling complex functions of the system as well as individual functions within such programs may be selected to be converted to hardware. For example, an entire calculator program originally implemented in software can be selected and converted to hardware or individual functions within the calculator program (e.g. ADD or SUBTRACT functions) can be selected and converted to hardware.

Once the software components are identified and corresponding hardware components are generated at 220, the selected software components are replaced by modified software components at 230 adapted to ensure that the system as a whole maintains its original functionality. Thus, an interface is created within the remaining software to communicate with the newly created hardware components. Such a modified software component may be necessary because the rest of the components of system continue to send input data to, and/or expect to receive output data from the function originally implemented in software. An interface is capable of directing such communications through to the newly generated hardware components.

Once some of the functions originally implemented in software are converted into hardware implementations, the original design of the system 100 of FIG. 1 is said to have been "repartitioned" or "partitioned"(if the system functionality was initially implemented entirely in software) between its hardware and software components. A more optimal design may be achieved in this manner. Selecting software components at 210, generating new hardware components at 220 and replacing the selected software components with modified functions at 230 are achieved automatically as will be described below in detail.

Figure 3:
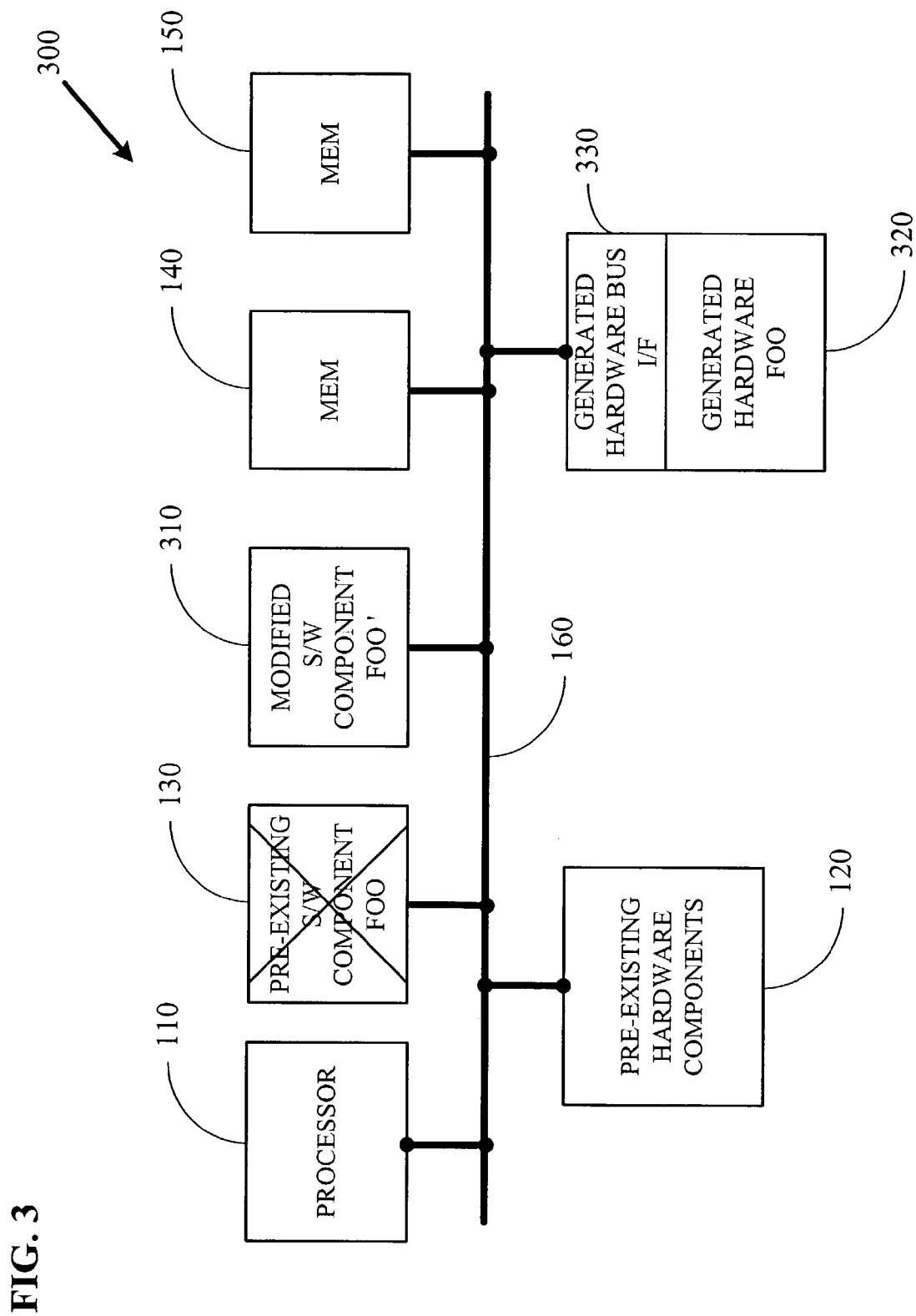
FIG. 3 is a block diagram of an exemplary hardware-software system after selected software components of the system are converted to hardware components according to the method of FIG. 2.

Exemplary Hardware-software System after Selected Software Components have been Converted to Hardware FIG. 3 illustrates the hardware-software system 100 of FIG. 1 after being repartitioned between its hardware and software components using the methods described above with reference to FIG. 2. In FIG. 3, the repartitioned system 300 has retained the processor instance 110, the memory elements 140 and 150, the system bus 160 and the pre-existing hardware components 120. However, as described above with reference to FIG. 2, a selected software component, such as FOO at 130, has been removed from the repartitioned system 300. The software component FOO 130 is replaced by the modified software component FOO '310 and a newly generated hardware component FOO 320. The modified software component FOO '310 in combination with the hardware 320 are adapted to enable the repartitioned system 300 to continue to maintain the same functionality as the original system 100 of FIG. 1. More specifically, the modified software component 310 may be adapted to direct the communications associated with the original software component FOO 130 to its corresponding newly generated hardware component at 320 in the repartitioned system 300.

Furthermore, it may be necessary to enable the newly generated hardware component 320 to send and receive communications with the rest of the system via the system bus 160. To that end, it may be necessary to generate a hardware interface 330. Using the modified software component 310 and the generated hardware interface 330, the designers can enable the newly generated component 320 to function with the rest of the system without changing the functionality of the original system 100.

A designer may achieve improved system performance by moving a selected software component, such as FOO 130, to a hardware implementation, such as the generated hardware component FOO 320, in the manner described above.

Although the exemplary methods above have been described by referring to moving a single function from a software implementation to a hardware implementation, they may also be used to move multiple functions implemented as software components simultaneously or at different times into a hardware implementation. Furthermore, the methods above are equally effective for "partitioning" a system initially implemented entirely software by moving selected functions of the system to hardware.

Exemplary Method for Automatically Converting Software Components in to Hardware The process of optimizing the system performance through repartitioning will be less valuable without the use of design automation tools that allow measurement and verification of hardware-software system's performance without having to create a physical implementation of the hardware components. Instead of physically implementing the hardware components of the system, the functions to be implemented as hardware may be described using a hardware description language (HDL) (e.g. Verilog or VHDL). The hardware description in HDL can then be used by hardware simulation tools such as logic simulators (e.g. ModelSim by Mentor Graphics® of Wilsonville, Oreg.) or hardware emulation tools for modeling the behavior of the hardware components. Such simulation and emulation tools are capable of modeling many hardware components including any processors or memory elements for executing the software components. In case of hardware emulators, the HDL description may be fed to synthesis tools (e.g. Leanordo Spectrum by Mentor Graphics® of Wilsonville, Oreg.) to generate a synthesis of the hardware components suitable for use by the emulator tools to model the behavior of the hardware components. Such tools allow a designer to verify and measure the performance of a hardware design without the need to develop a physical implementation of the hardware. Such tools may be used in conjunction with other tools for automatically generating hardware implementations of selected software components to repartition a system. Also, once the system is repartitioned, the system performance may need to be measured again to evaluate whether the repartitioning improved system performance.

Figure 4:
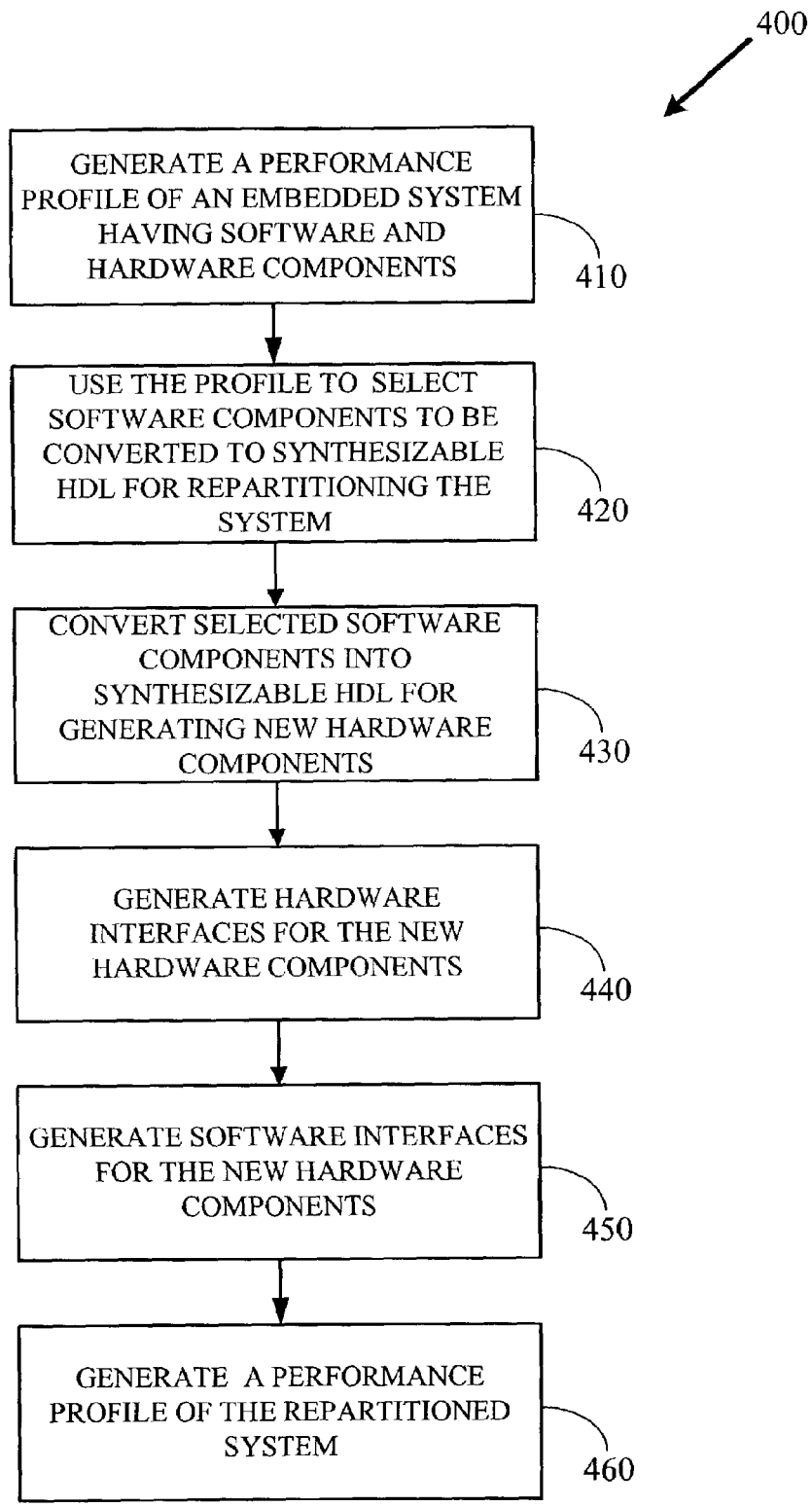
FIG. 4 is a flow chart depicting an exemplary method for optimizing the performance of the hardware-software system by selectively converting software components of system to hardware components and evaluating the performance of the repartitioned system.

FIG. 4 shows such an automated process 400 for selecting a software function to be moved to a hardware implementation, repartitioning the system by making such a move, and evaluating the performance of the repartitioned system without having to create a physical implementation of its hardware components. At 410 a performance profile of a hardware-software system is generated, which is used at 420 to select the software components to be moved to a hardware implementation in the repartitioned system. Such a performance profile includes data indicative of the system's performance as whole and particularly data relevant to the execution of the various functions implemented as software components. For example, data relevant to software execution may include time data associated with execution of the software instructions, and memory and bus transactions initiated by processor during the software execution. Using such profile data, a designer will be able to determine which of the software functions most negatively impact the performance of the system and select such software components to be moved to a hardware implementation (process block 420).

Software components may originally be developed using any of the numerous computer-programming languages (e.g. C, C++ or JAVA). Once the software components are selected to be moved to a hardware implementation, at 430 a synthesizable HDL description of the selected components may be generated by converting their current description in a programming language. The synthesizable HDL description can later be used to model the software component as a hardware component.

Next, at 440 hardware interfaces are generated to enable the newly generated hardware components to communicate with the rest of system. Primarily, the interfaces are adapted to enable the newly generated hardware components to receive input parameters from and to provide output data to the rest of the system. If the newly generated hardware components are being modeled as opposed to being physically implemented in hardware logic, the hardware interfaces are also generated in form of their HDL description. However, they may be generated as a high-level algorithmic description and later converted to HDL or initially generated in a programming language and later converted to HDL.

Then at 450 the software components of repartitioned system are modified to replace the converted software components. The modified software components are software interfaces adapted to intercept and direct system communications related to original software components to their corresponding newly generated hardware components.

Once the software and hardware interfaces are generated at 440 and 450, a repartitioned form of the original system is evaluated to determine whether the repartitioning enhanced system performance. A performance profile of the repartitioned system is generated at 460 to analyze whether the system performance may be improved through further repartitioning. Process blocks 410–460 may be repeated as many times as necessary for the designer to attain an optimal design.

Exemplary Tool for Modeling a Hardware-software System

Figure 5:
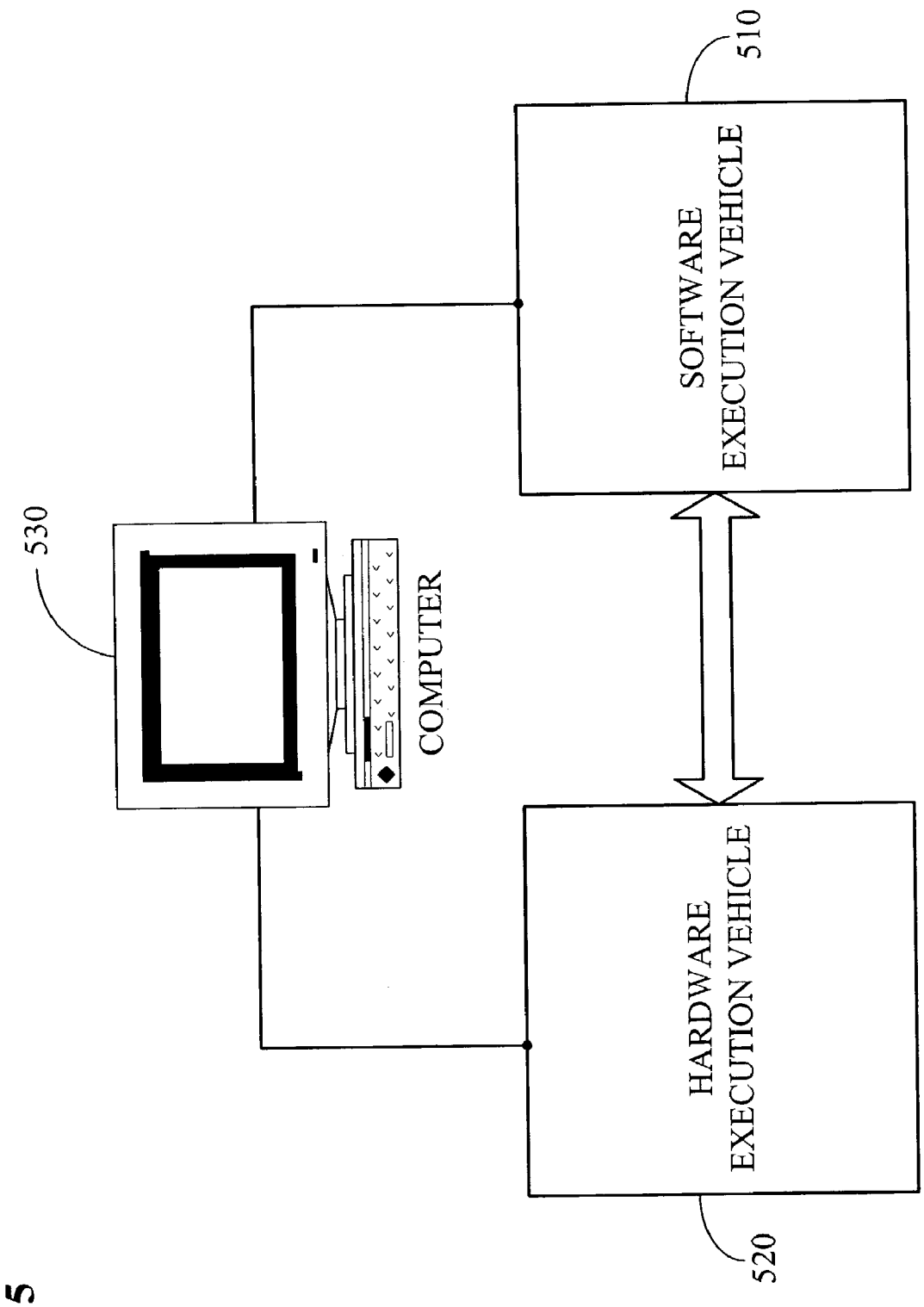
FIG. 5 is a block diagram of an exemplary tool for optimizing the performance of a hardware-software system.

To generate a performance profile, the system may be physically implemented or its hardware components may be modeled on a modeling tool, such as an emulator or a simulator. FIG. 5 illustrates an exemplary tool for modeling the behavior of a hardware-software system. The tool comprises a software execution vehicle 510 adapted for modeling the behavior of processors that execute the software components of the system. The tool also comprises a hardware execution vehicle 520 for modeling the behavior of the hardware components of the system.

For example, software execution vehicle 510 may be one or more Instruction Set Simulators (ISS) that are adapted to emulate the behavior of a particular processor. Typically, an ISS emulates a processor's execution of instructions from a compiled software program. Thus, an ISS has the ability to mimic the functionality of a processor and is typically unique to a processor. For example, the ARMulator™ is an ISS that is unique to the processors based on processor designs licensed by ARM® Ltd. of Cambridge, England. Likewise, other processors may have their own corresponding ISSs. The software execution vehicle may also be implemented by using In Circuit Emulators (ICE) or other well-known devices. Less complex processors may even be emulated by a physical implementation of a gate level logic design, which can be driven by software components. However the processor may be modeled, it is desirable that the software execution vehicle be capable of generating the data associated with the execution of the software components for creating the performance profile.

Also, the hardware execution vehicle may be implemented in many different ways. For example, a logic simulator may be used to model the hardware components. A typical logic simulator is capable of interpreting hardware design descriptions in various forms (e.g. HDL) and providing overall control of simulating the functionality of the design. An example of a logic simulator is ModelSim™ by Mentor Graphics® of Wilsonville, Oreg. The hardware execution vehicle may also be implemented using FPGAs, accelerators (e.g. an IKOS machine from Mentor Graphics of Wilsonville, Oreg.) or ICEs programmed to implement the functionality of hardware components of the system. Furthermore, the hardware execution vehicle may be a general purpose computer programmed to implement state machines with functionality of the hardware components of the system. These state machines may be adapted to be identical in their timing characteristics to a physical implementation of the hardware components of the system. The programming required to implement the state machines may be accomplished using any of well known programming languages (e.g. C, C++, JAVA).

To simultaneously verify the performance of hardware and software components of a system, the software execution vehicle 510 and the hardware execution vehicle 520 communicate with each other. Furthermore, a computer 530 may be provided to control the execution of the software execution vehicle 510 and the hardware execution vehicle 520. A source code debugger program (not shown) may be used by the computer 530 to control the execution of the software components on the software execution vehicle 510. A debugger provides a user greater control over the execution of a software program, for example, by allowing the user to set break points to stop the execution as desired for debugging and troubleshooting. Similar controls may be implemented for the hardware execution vehicle.

The software execution vehicle and the hardware execution vehicle do not have to function simultaneously to model the hardware-software system. In order to decide which software component should be moved to hardware for repartitioning, a designer may model the execution of the software components separately. For example, the designer may execute the software component separately on a general purpose computer and use profiling software (e.g. Microsoft® Visual Studio® or Rational® Purify®) to collect performance data related to software execution. The performance data provided by the profilers may later be used to select the software component to be moved to hardware. However, such methods do not provide the complete picture of the execution of a system having both hardware and software components. Without a complete picture the designers cannot truly optimize the system performance. Better modeling of a system having hardware and software components is possible by modeling the system as a whole with the hardware and software components functioning together.

Once the hardware execution vehicle and the software execution vehicle are functionally communicative and there is a mechanism in place to control the execution, the performance data related to the system may be collected for creating a performance profile indicative of the system's performance. Designers may use the profile to decide which software components are to be moved to repartition the system and use the tool again to determine whether repartitioning improved the system's performance. The collection of the performance data and the processing of the collected data to create a profile may be done using the same computer 530 or by programming other computers.

Alternatively, the collection of data may also be accomplished separately using test equipment well known in the art (e.g. logic analyzers) and the collected data may later be processed to create a profile.

Exemplary Implementation of a Tool for Modeling a Hardware-software System

The software execution vehicle 510 and the hardware execution vehicle 520 of FIG. 5 may be connected together directly such as on a test board with the various FPGAs modeling both the hardware components of the system and the processors executing the software components.

Figure 6:
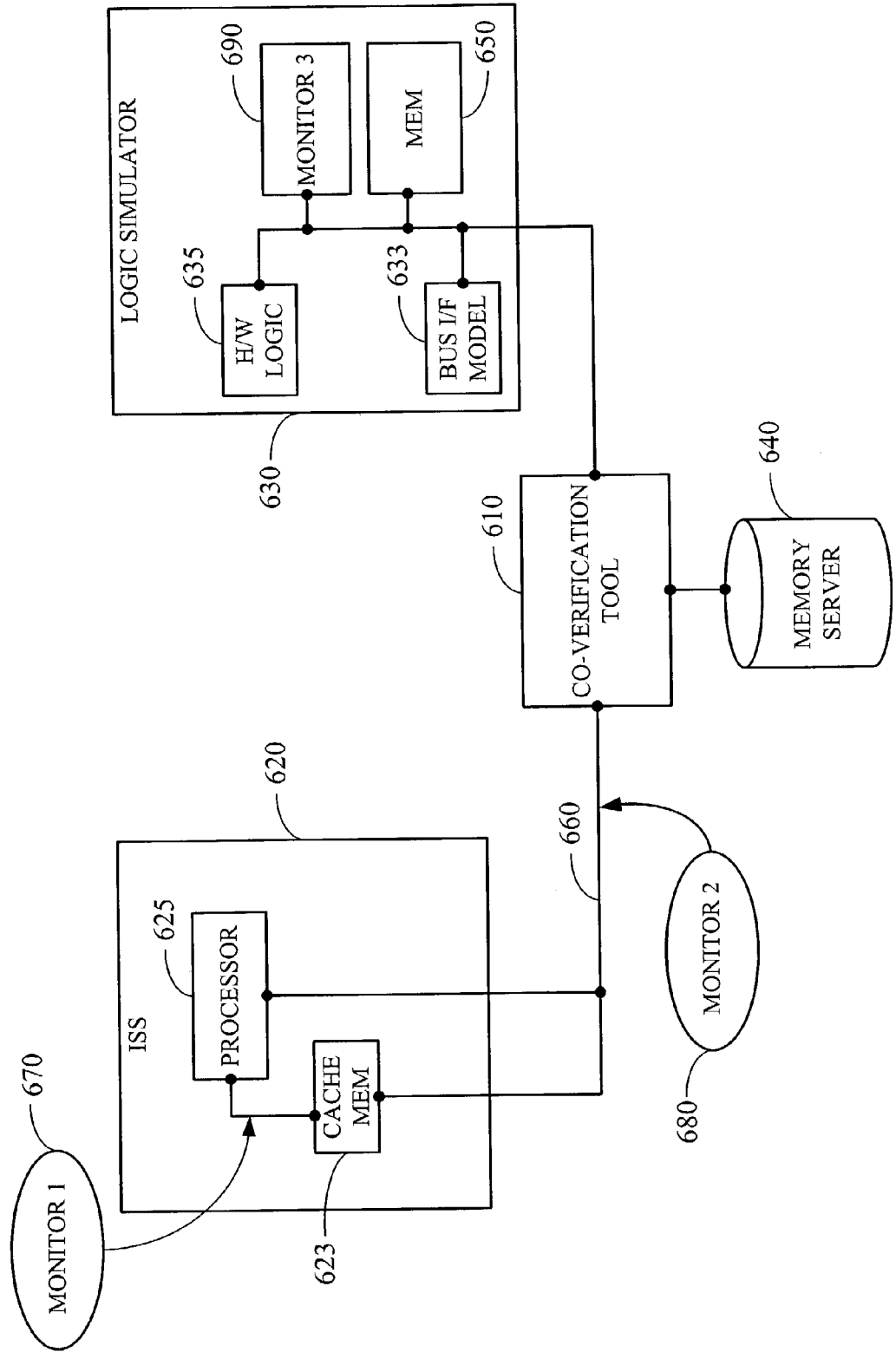
FIG. 6 is a block diagram depicting an exemplary implementation of the tool shown in FIG. 5.

Alternatively, if one or more ISS's are used as software execution vehicles and logic simulators are used as hardware execution vehicles, a hardware-software co-verification tool may be necessary for modeling the system performance. FIG. 6 illustrates such an exemplary co-verification tool 610 being used in conjunction with an ISS 620 for emulating the processor instance 625 and a logic simulator 630 simulating the hardware logic 635, the system bus 660, the bus interface model 633 and the memory elements 650. The bus interface model 633 has the same pin out as the processor instance 625 being simulated by the ISS 620 and is capable of simulating the communication of the processor instance 625 with the rest of the system. A bus interface model 633 may be necessary because typical ISS's are only capable of emulating the processor instance 625 executing instructions and do not have the capability to drive the communications through to the rest of the system being simulated.

A co-verification tool such as 610 is described in U.S. Pat. No. 5,771,370 (hereafter "the '370 patent") to Klein. When simulating a hardware-software system using ISS's 620 and logic simulators 630, the memory transactions related to software execution may be simulated using the logic simulators 630. However, simulating memory transactions or bus transactions using logic simulators 630 may be time consuming. Typical logic simulators 630 execute at a speed of 1 instruction per second and high-end simulators may execute 2–3 instructions per second. However, typical software programs generate a great number of memory transactions and bus transactions. Thus simulating the execution of software components of a system using simulators can be very time consuming. Although, typical ISS's 620 execute at a speed of 1,000,000 instructions per second they do not have the capability of emulating the bus transactions and the hardware components of a system. Therefore, the co-verification tool 610 may be necessary to model the memory transactions and bus transactions of a system to speed up the modeling process.

The co-verification tool 610 such as the one described in the '370 patent provides a memory server 640 which stores the software components or data elements typically stored in the memory elements associated with a system (e.g. 650). Instead of using the logic simulator 630 to interact with memory elements 650, the ISS 620 uses the co-verification tool 610 to communicate with the memory server 640 to retrieve instructions from the software components or data elements stored therein. When compared to interacting with the simulator 630, interacting with the memory server 640 is much faster. Thus, using a co-verification tool 610 allows a designer to model the behavior of a hardware-software system having complex software components and do it within times that are reasonable for a designer to pursue repartitioning.

Exemplary Method for Generating a Performance Profile

Figure 7:
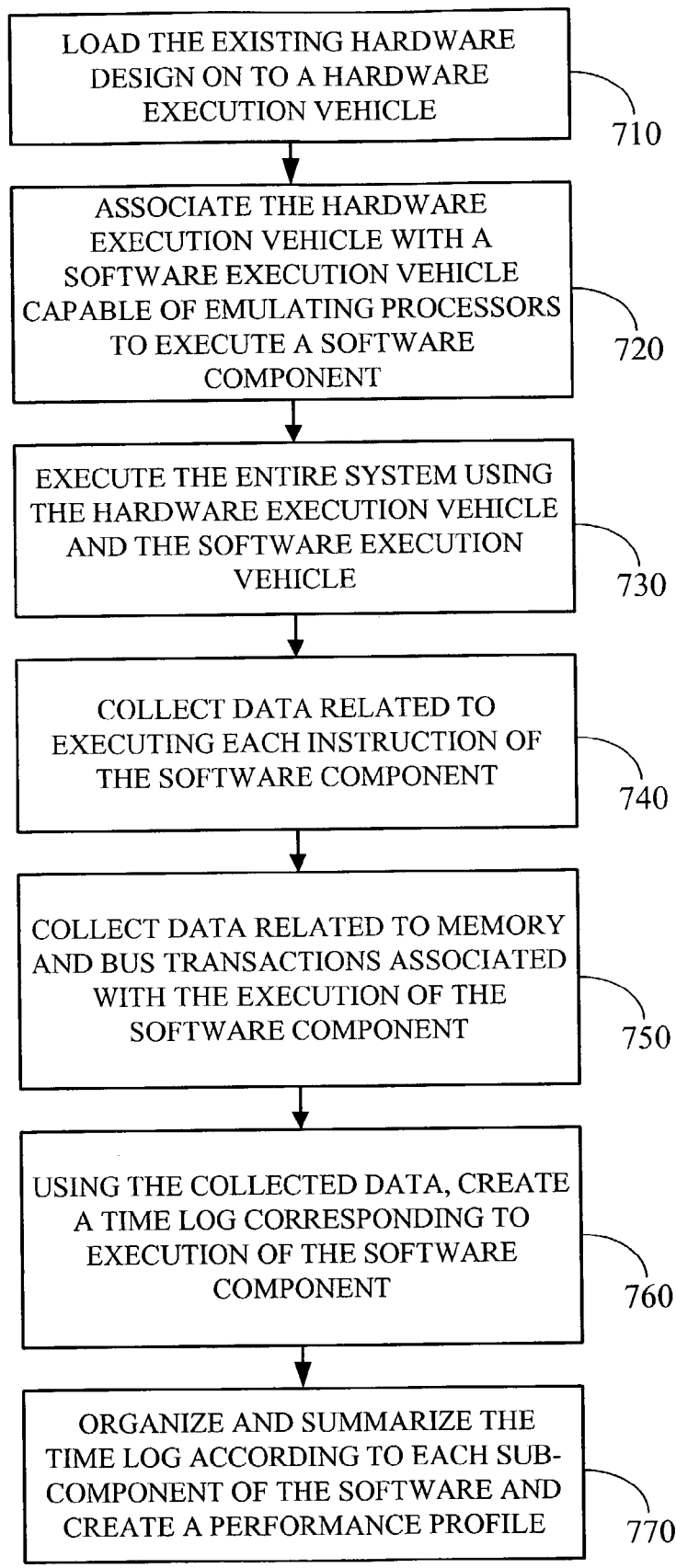
FIG. 7 is a flow chart of an exemplary method for generating a performance profile of the hardware-software system.

Once a tool for modeling the execution of software and hardware components of a hardware-software system is in place, the modeling tool may be used to generate a performance profile of the system for optimizing the system performance as described with reference to FIG. 4. FIG. 7 illustrates such an exemplary method for generating a performance profile corresponding to the process 410 of FIG. 4. The performance profile may be used, among other things, for selecting the software components to be converted to a hardware implementation. At 710, the existing hardware design is loaded onto to a hardware execution vehicle for modeling or implementing the hardware logic related to the hardware-software system. At 720, the hardware execution vehicle is associated with a software execution vehicle capable of modeling the execution of the software components on processors associated with the system. The software execution vehicle and the hardware execution vehicle may be implemented as described with reference to FIG.'s 5 and 6. Once the software and hardware execution vehicles are functional at 730, the system is executed for collecting the data related to its performance. At 740, data related to executing each instruction of the software components is collected. At 750, memory transaction and bus transaction data related to the execution of the software components is collected. Once the data related to execution of instructions, memory transactions and bus transactions are collected, a time log corresponding to execution of the software component is generated at 760. Finally at 770, the time log is organized according to the various sub-components of software being executed to create a performance profile to be used for optimizing the system performance.

Exemplary Time Log Used for Generating a Performance Profile of a Hardware-software System FIG. 8 illustrates an exemplary time log 800 for creating the performance profile of a hardware-software system. The time log 800 is generated by monitoring the performance of the hardware-software system as the system is executed on the modeling tool comprising hardware and software execution vehicles of FIG. 5. The time log 800 contains a record of data related to the execution of the instructions of the software components, memory and bus transactions. As shown in column 803, the time log may be ordered in time using a time stamp starting at 0 to the end of the simulation as measured by a system clock. The time log 800 may also track the nature of the transactions as shown in column 810, which lists such transaction types as memory, branch (which is related to execution of software instructions) and bus. Also, the source and destination address for each of the transactions are recorded at the "from" column 815 and the "to" column at 820, respectively.

In one embodiment, only the branch records related to the software instructions executed by the processors is recorded in the time log 800. The entry into a branch related to particular software component and the exit from the branch may be determined by tracking the source address 815 and destination address 820 related to each instruction. Once the addresses are known, executable files associated with the software components may be opened to access their symbol tables. The symbol tables list each of the various software components, their address locations and word sizes. The address information in columns 815 and 820 is compared to the symbol tables to identify which software component is associated with the instructions being executed in the time log 800.

For example, if a software component, such as function FOO, has an address location between 1000–1200 and a word size equal to 4 and the time log has a branch record 825 with a source address of 123 at 821 and a destination address 1000 (which is within the range 1000–1200) at 822 then a branch entry into function FOO is identified. The next few time log records show that several other instructions related to function FOO were executed within the address range corresponding to FOO at 830, 835 and 840. However, at some point later at 845 the time log shows an exit from the FOO branch because the destination address 127 at 823 is equal to the original source address outside FOO 123 at 821 plus the word size 4. Thus, time log records 825–840 are identified as branch records associated with the software component, function FOO. The same process may be repeated to identify all the branch records associated with function FOO. However, word sizes may vary according to processors. For example, a processor with 16-bit instruction architecture may have a word size of 2 instead of 4.

Alternatively, it is also possible to record each and every instruction related to FOO instead of just recording the entry and exit into branches. However, such entries will create a large amount of data to be manipulated for creating the profile without adding much value to the accuracy of the profile itself.

Exemplary Summary Table used for Generating a Performance Profile

Once the branch records associated with the execution of each of the software components are identified, then the records may be summarized and ordered according to each software component. FIG. 9 shows the data extracted from the time log 800 of FIG. 8 ordered in the form of a summary table 900. The various components are listed in column 910. Using the time stamp column 803 of FIG. 8, the processing times associated with the branch records of each function is added to yield the total time spent by a software execution vehicle executing each of the software components at column 920. This may be translated to a percentage figure in column 930 to rank each of the components according to the demand each of them are likely to place on the processors. For example, in FIG. 9 function FOO is most likely to dominate a processor's time and thus a good candidate to be moved to a hardware implementation.

Profile of Software Instruction Execution

Figure 10:
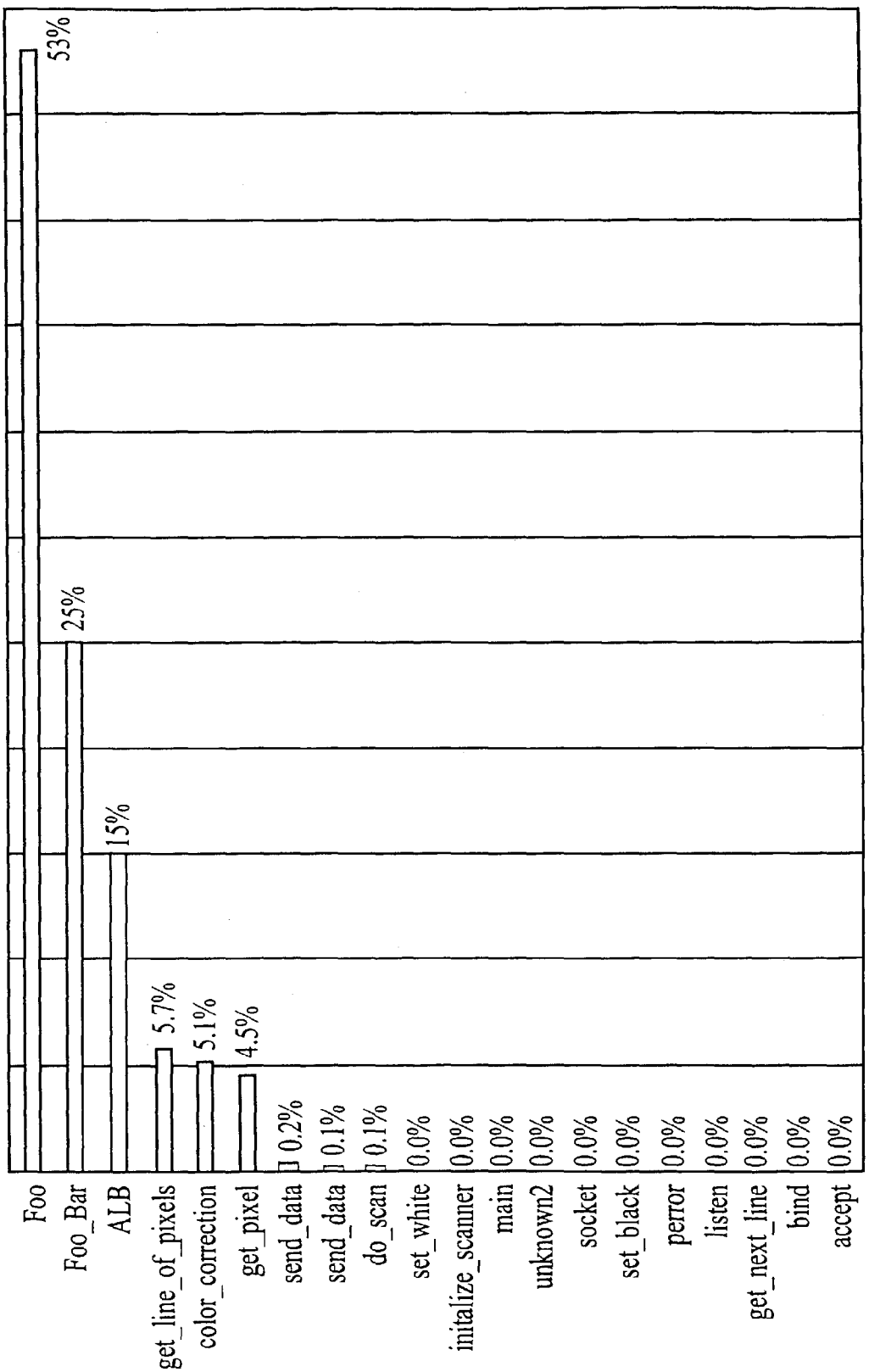
FIG. 10 is an exemplary bar chart corresponding to the summary table of FIG. 9.

FIG. 10 is an illustration of a bar chart that may be used to illustrate the profile data generated using the time log of FIG. 8 and a summary table, such as the one in FIG. 9.

Profile of Memory Transactions

Besides the time data related to execution of software components, other data related to execution of the components are important to a designer for deciding which component should be moved to a hardware implementation. Although it is generally true that moving it to hardware can increase the processing speed of executing a software component, such a change may impact the system as a whole in other aspects. For example, the number of memory and bus transactions may increase as the newly converted hardware component reads and writes data. This could slow down the processing speed of the system as a whole even though the individual function is being executed faster in its hardware implementation. Therefore it may be desirable to analyze the time log 800 of FIG. 8 to identify the memory and bus transactions related to the execution of a software component. Once the selected software components are converted to hardware the memory and bus transactions related to the repartitioned system may be analyzed again to identify whether the system performance as a whole improved or not.

Figure 11:
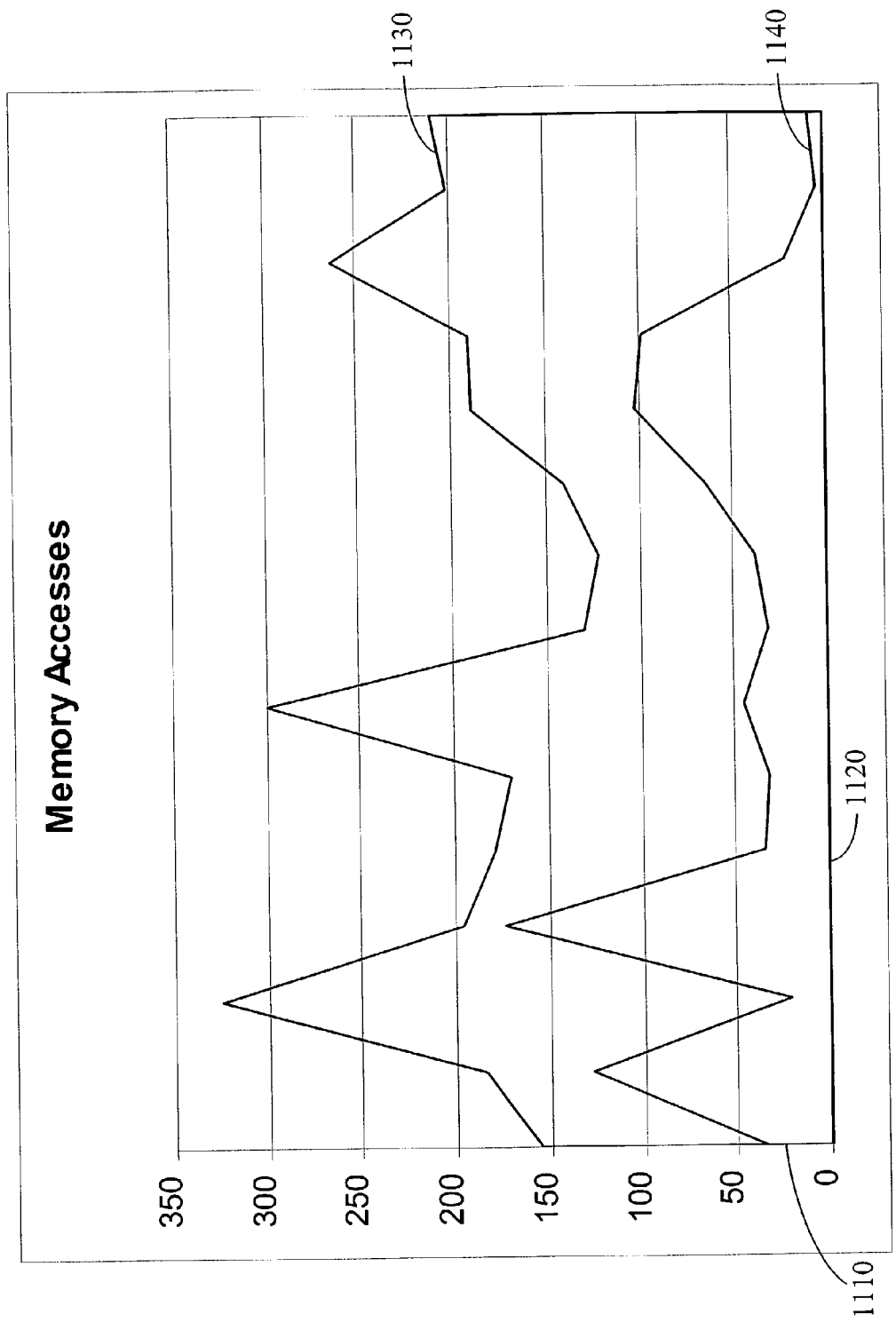
FIG. 11 is a chart profiling the memory transactions related to execution of the software components.

FIG. 11 illustrates a chart profiling the memory transactions related to the execution of the software components prior to repartitioning. The chart shows the number of memory accesses on the y-axis 1110 versus time which is shown on the x-axis 1120. The access data may also be split between the memory reads at 1130 and the memory writes at 1140. Within the time log 800 the individual memory transactions are matched to their corresponding software component using the time stamp column 805. The memory transaction associated with the execution of a particular function will occur within the same time frame as the execution of the instructions related to the function. In this manner memory transactions can be profiled not only by totaling all transactions of the system but also by transactions related to each individual function. A similar profile may be a generated after the system is repartitioned to compare the impact of repartitioning on the memory transactions. For example, if the function FOO is moved to hardware and replaced by a modified function FOO' for repartitioning then memory transactions related to FOO prior to repartitioning may be compared with transactions related to FOO' after repartitioning.

Profile of Bus Transactions

Figure 12:
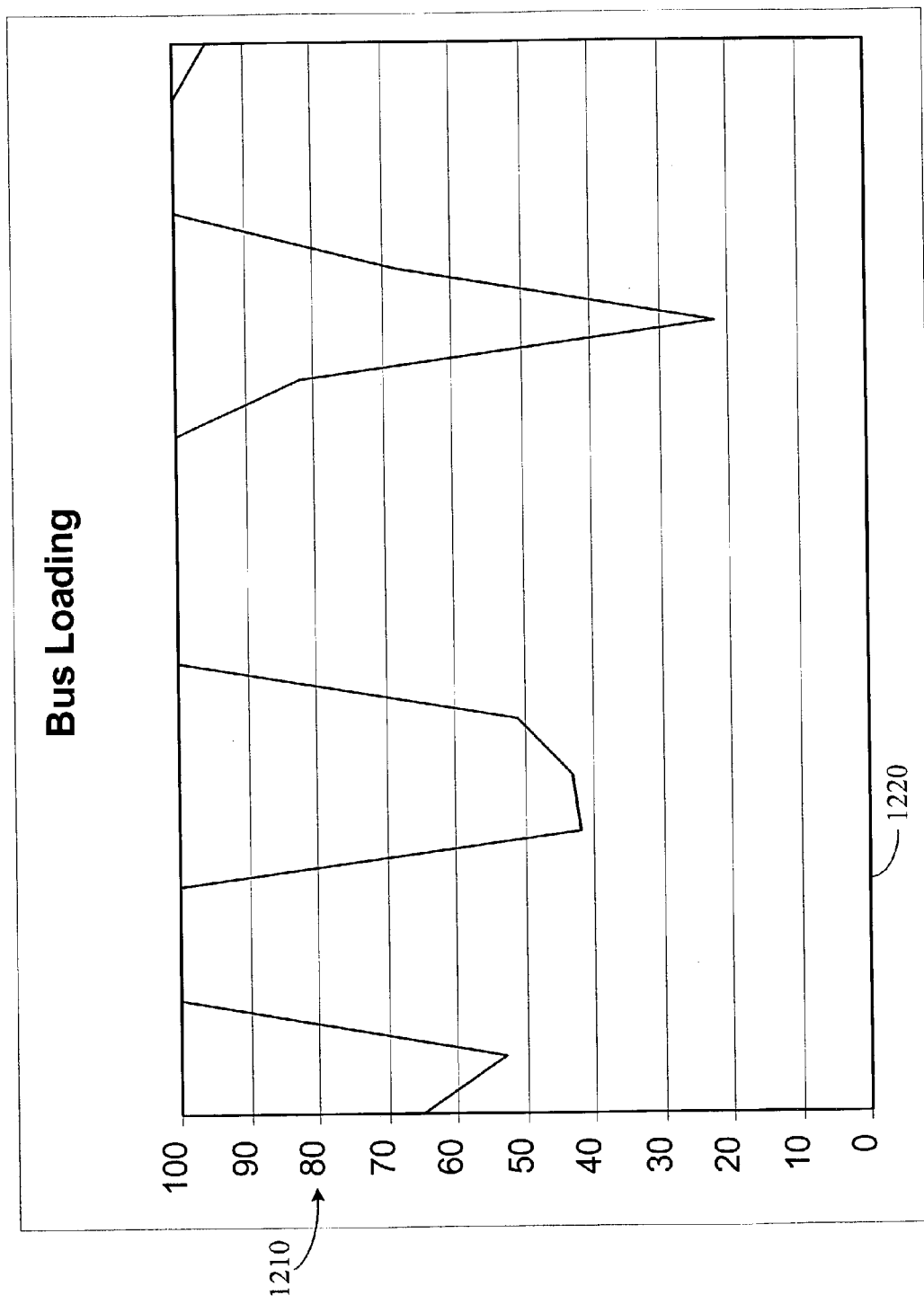
FIG. 12 is a chart profiling the bus transactions related to execution of the software components.

Similar to memory transactions described above, bus transactions before and after repartitioning may be compared to determine whether repartitioning was beneficial or not. FIG. 12 shows bus load data prior to repartitioning. The time log 800 of FIG. 8 may be used to identity times when a particular system bus was owned by a master and those times it was not owned by any master. This bus load data can be translated to a percentage of bus utilization as shown on y-axis 1210 of FIG. 12 and tracked over time on the x-axis 1220. A similar bus utilization profile can be generated for a repartitioned system to determine whether repartitioning had a positive impact on the system performance. The bus transactions may be matched to the corresponding functions or software components initiating them by matching each bus transaction's source and destination address on columns 815 and 820 to that of the addresses related to the corresponding software component. Tracking the bus transactions may be necessary because even if the processing speeds of selected components are increased by moving them to a hardware implementation the bus utilization may be negatively affected thereby slowing down the processing speed of the system as a whole.

Exemplary Method of Generating a Performance Profile for a Hardware-software System Being Simulated Using ISS's and Logic Simulators As shown in FIG. 6 one method of simulating the execution of a hardware-software system is to use ISS 620 to serve as software execution vehicles, logic simulators 630 to serve as hardware execution vehicles and a co-verification tool 610 to connect the two vehicles. Typical ISS are only capable of emulating processors. They do not have the ability to indicate the time taken for executing each instruction run by the processor. Therefore in order to generate a time log, such as the one shown in FIG. 8 (using the simulation environment of FIG. 6), the ISS 620 may need to be annotated with time data related to execution of various instructions. Such data may be obtained through the manufacturers or designers of the processors being emulated. Some ISS's may already be equipped with such data.

Once the ISS 620 is annotated with time data related to execution of instructions, the simulation of a system may be monitored to collect the performance data necessary to generate a time log such as the one shown in FIG. 8. A monitor 1 at 670 in conjunction with the ISS 620 can monitor the execution of instructions within the ISS and use the annotated time data to generate instruction execution records in time log of FIG. 8. The same monitor can also record the memory transactions initiated by the simulated processor instance 620 with the associated cache memory 623.

At times during the simulated execution, the ISS 620 may need to go to memory elements other than the cache memory 623 to perform memory read and write operations. Such instances create bus traffic on a bus such as 660 connecting the ISS to the rest of the simulated system through the co-verification tool 610. Another monitor, monitor 2 (shown at 680) can be within the co-verification tool 610 to monitor such transactions. These transactions may be logged in the time log as both a memory transaction and an associated bus transaction initiated by the simulated processor instance 625. Another monitor, the monitor 3 at 690 may be used to record the memory transactions and the bus transactions initiated by other hardware components 635 of the system. All records generated by the monitors mentioned above could be added to create the time log as shown in FIG. 8.

Within the ISS 620 and the co-verification tool 610, the monitors 670 and 680 can be implemented as software functions adapted to generate a record entry in the time log whenever the ISS advances through instructions within the execution queue of the simulated processor 625. The monitor at 690 may be implemented in HDL in order to be simulated within the logic simulator 630. Thus, using the monitors 670, 680 and 690 a time log, such as the one shown in FIG. 8, can be generated using the simulation environment of FIG. 6.

Figure 13:
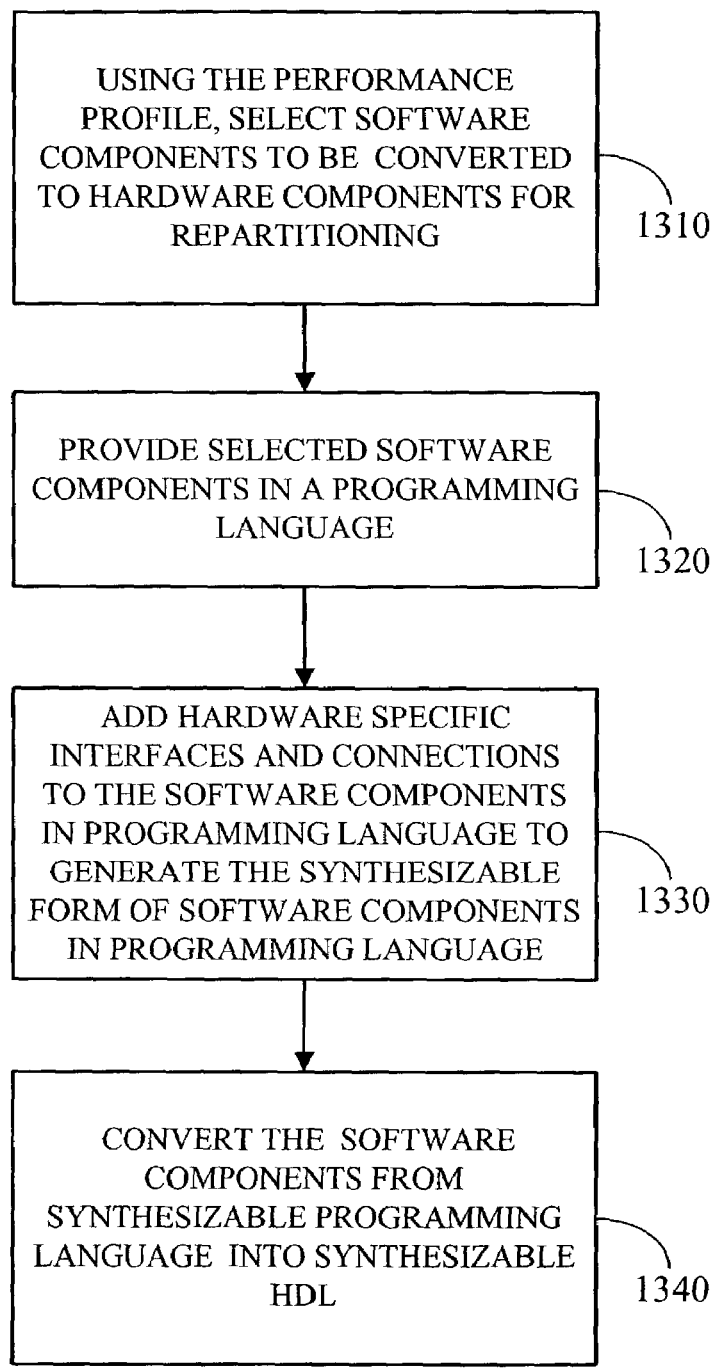
FIG. 13 is a flow chart of an exemplary method for converting a software function described in a programming language into synthesizable HDL.

Exemplary method for converting software components from a programming language to synthesizable HDL Once the performance profile of a hardware-software system is generated, the profile may be used to select the software components to be converted to hardware for optimizing the system performance (see 420 in FIG. 4). According to the process at 430 of FIG. 4, the selected software components are to be converted from a current form in a programming language (e.g. C, C++ or JAVA) to a corresponding form in HDL. FIG. 13 shows an exemplary method for automatically converting the software components from a programming language to synthesizable HDL, which is later used to emulate or simulate the newly generated hardware components.

The performance profile of the system is used to select software components to be converted to hardware at 1310. Then at 1320, the software components are provided in a programming language. At 1330, the software components in a programming language are converted to a synthesizable form in the programming language. This may be necessary since the software components in their original programming language form do not describe the input and output connections necessary to connect the newly generated hardware component to the rest of the system. For example, the surrounding hardware to be connected to the new hardware component may need to be specified in order to generate the synthesizable HDL. Such a synthesizable form of the software component in its programming language form may be used at 1340 to generate the synthesizable HDL. One way to convert the software components in a synthesizable form of programming language may be to translate it to high-level flow charts that correspond to the functionality of the software components. Such high-level flow charts may then be used to generate the synthesizable HDL. Several tools that are currently available have the ability to convert software components in a programming language to a HDL representation (e.g. Behavioral Compiler™ by Synopsys® of San Jose, Calif. and DK1 by Celoxica® of Abingdon, UK). Additionally, such tools are also described in U.S. Pat. Nos. 6,021,266 to Kay, U.S. Pat. No. 6,438,739 to Yamada and U.S. Pat. No. 6,449,763 to Yamada et. al. An emulator or a simulator to model the newly generated hardware component could use the synthesizable HDL for modeling the repartitioned hardware-software system.

Figure 14:
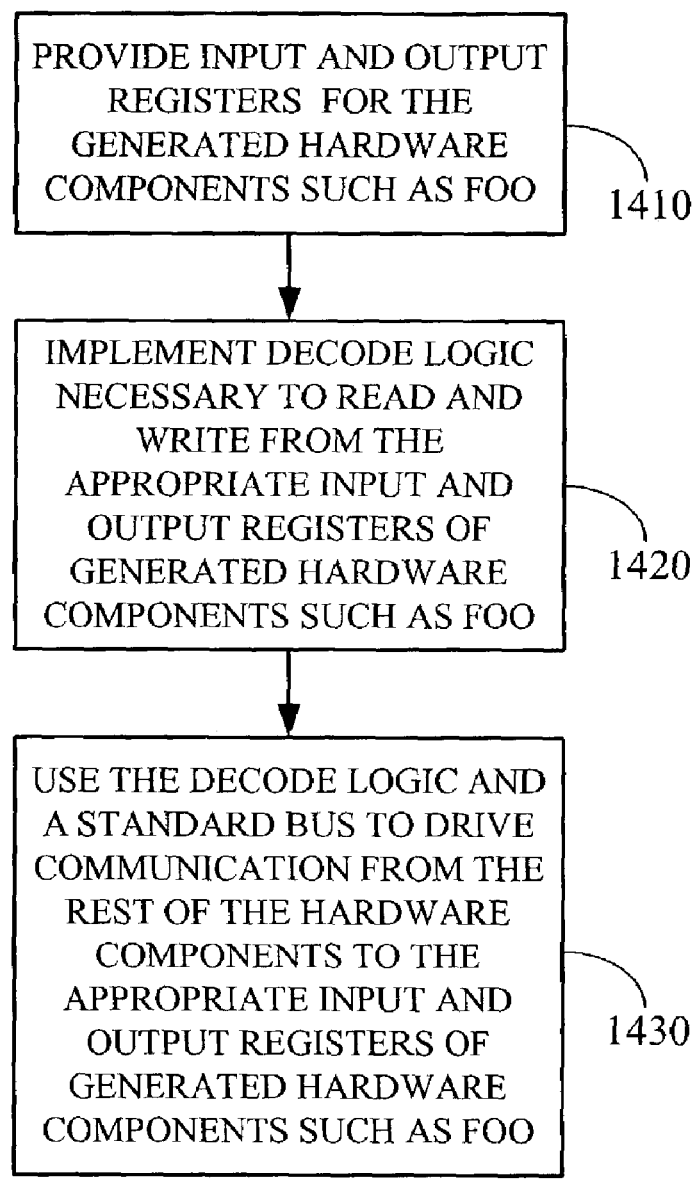
FIG. 14 is a flow chart of an exemplary method for generating a bus interface in hardware for enabling the generated hardware component to communicate with the rest of the repartitioned hardware-software system.

Exemplary Method for Creating Hardware Interfaces for the Newly Generated Hardware Component to Communicate wWith the Rest of the System The newly generated hardware components corresponding to the converted software components may need to be adapted to communicate with the rest of the system for receiving inputs and providing outputs. FIG. 14 illustrates an exemplary method for generating such a hardware interface or device driver. When the new hardware component (e.g. hardware FOO) is generated it is provided with input and output registers for receiving input data and sending output data at 1410. The input and output registers correspond to input and output data associated with the converted software component (software FOO). However, the bus (any standard industry bus e.g. AHB) associated with the newly generated component may not be capable of driving the input data into the appropriate input registers and retrieving the data from the appropriate output registers. Therefore at 1420 address decode logic is implemented to read from and write to the appropriate registers of the newly generated hardware component. Such decode logic can then be used along with a standard bus to drive the communication of the new hardware component with the rest of the system 1430. For example, when input data is received from the rest of the system, the decode logic may be used to correlate the address associated to the input data to the appropriate input register within the newly generated hardware logic. The same process is repeated for the output data. This enables the rest of the components to communicate with the newly generated hardware components.

Figure 15:
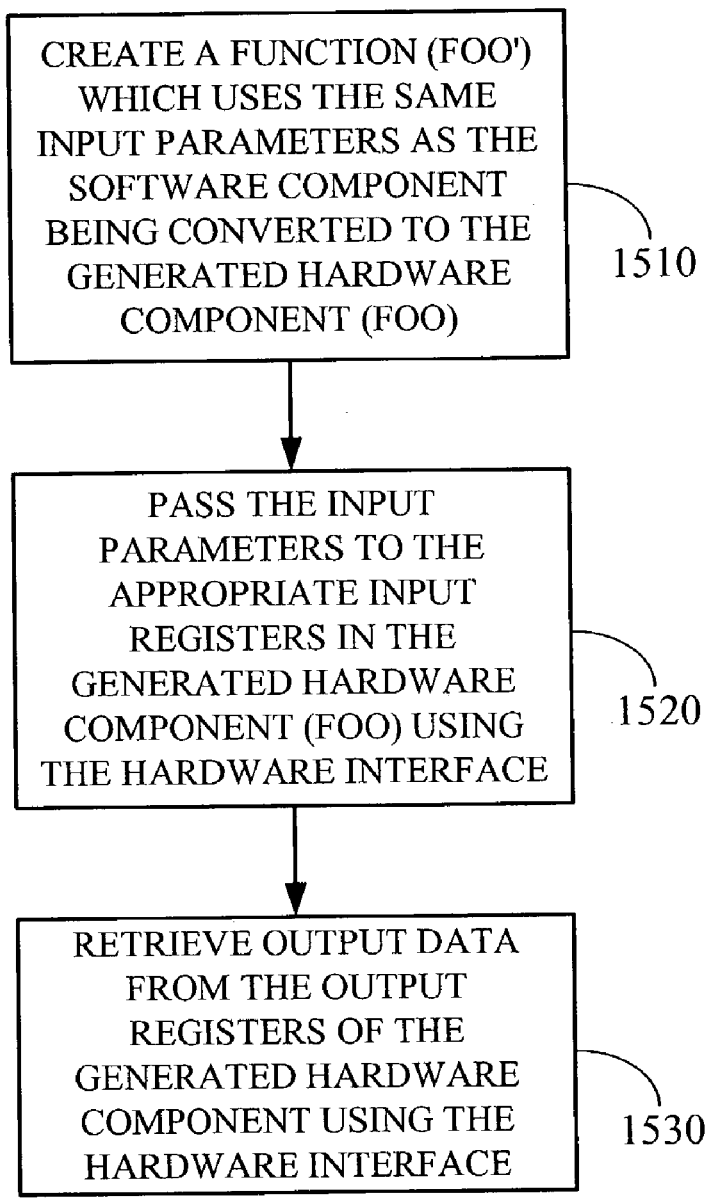
FIG. 15 is a flow chart of an exemplary method for generating an interface in software for enabling the modified software components to communicate with the rest of the repartitioned system.

Exemplary Method for Creating Software Interfaces for the Newly Generated Hardware Component to Communicate with the Rest of the System Once the software components (e.g. FOO) are selected and moved to a hardware implementation, the source code associated with such components is removed from the original software. However, a mechanism may be necessary to redirect the communications related to the original function (software FOO) to the corresponding hardware implementation (hardware FOO) after repartitioning. FIG. 15 illustrates an exemplary method for generating an interface for directing the communication between the rest of the software components and the newly generated hardware components. At 1510 the original software components (e.g. FOO) selected to be moved to hardware is replaced with modified components (e.g. FOO') in code which has the same function name and signature as the original component. The modified components omit the internal implementation of the original software components in code but are adapted to pass the input parameters to the appropriate registers of the newly generated hardware components at 1520. Furthermore, at 1530 the modified components are adapted to retrieve output data from the appropriate output registers of the newly generated hardware components and pass the data to other components of the system. The decode logic created for generating hardware interface (as described above with reference to FIG. 14) is used by the software interface to enable the communication of the newly generated hardware component with the rest of the system.

Use of a Client-server Network

Figure 16:
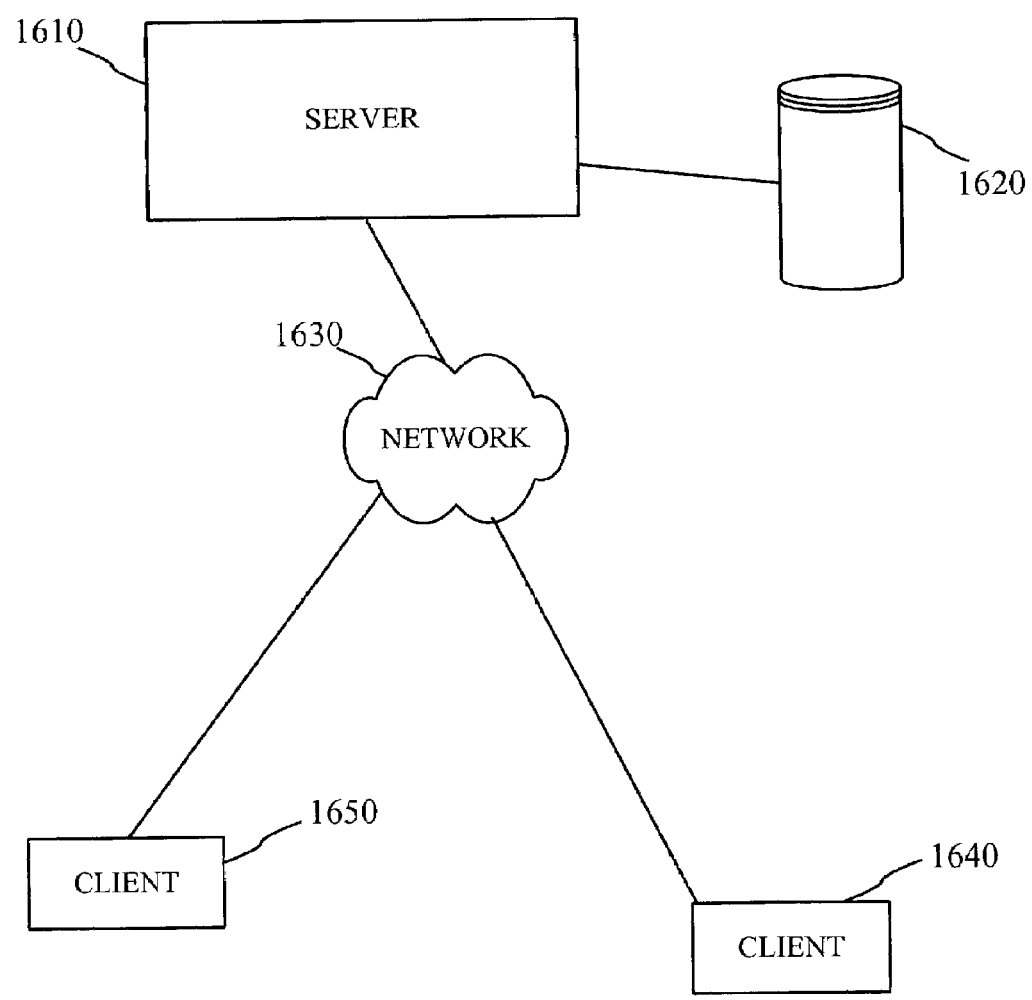
FIG. 16 is a diagram illustrating an exemplary client-server network environment.

Any of the aspects of the method described above may be performed in a distributed computer network. FIG. 16 shows an exemplary network. A server computer 1610 may have an associated database 1620 (internal or external to the server computer). The server computer 1610 may be configured to perform any of the methods associated with the above embodiments. The server computer 1610 may be coupled to a network, shown generally at 1630. One or more client computers, such as those shown at 1640, 1650, may be coupled to the network 1630 and interface with the server computer 1610 using a network protocol.

Figure 17:
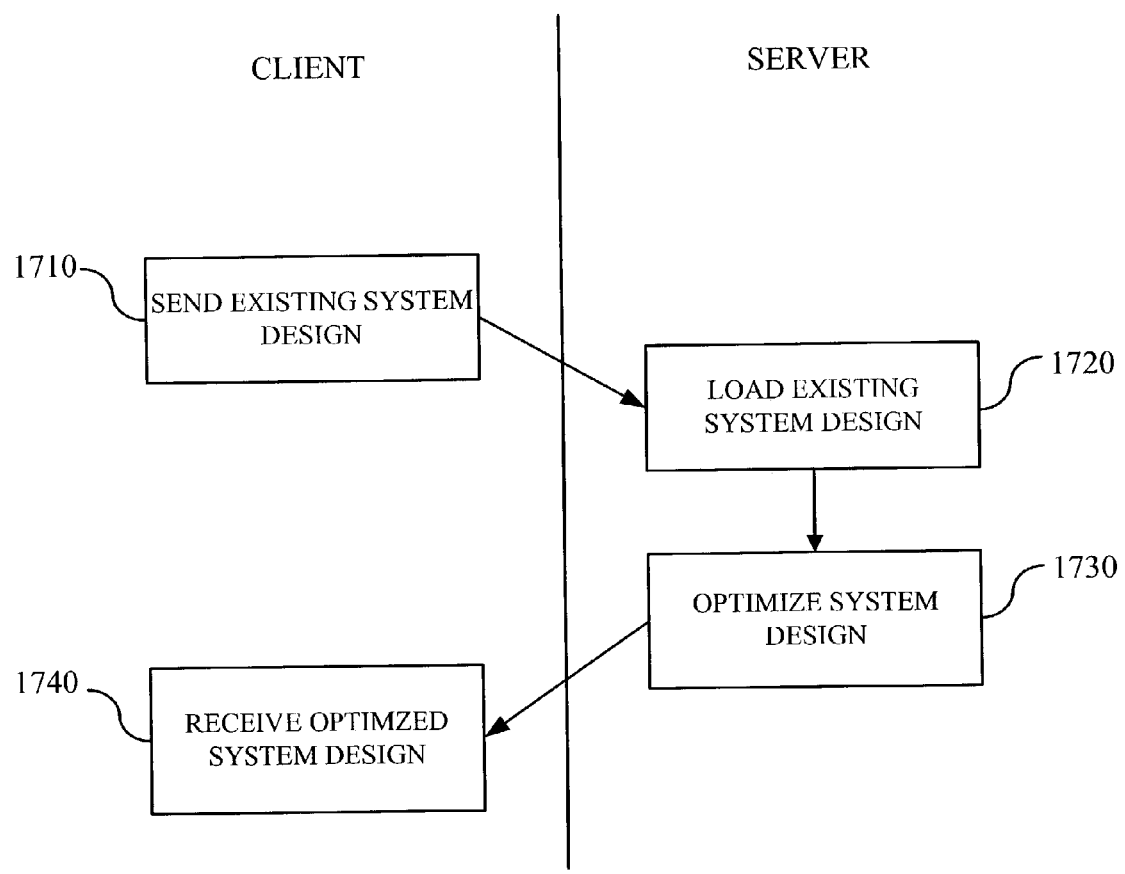
FIG. 17 is a diagram illustrating an exemplary method of optimizing a hardware-software system design using a client-server network, such as the one illustrated in FIG. 16.

FIG. 17 shows that a hardware-software system design may be optimized according to the disclosed method using a remote server computer, such as a server computer 1710 in FIG. 16. In process block 1710, the client computer sends data relating to the existing design of a hardware-software system for which an optimal design is to be calculated. In process block 1720, the data is received and loaded by the server computer. In process block 1730, the method disclosed above is performed and an optimal system design is calculated and selected. In process block 1740, the client computer receives the optimal system design sent by the server computer.

Alternatives

Having illustrated and described the principles of the illustrated embodiments, it will be apparent to those skilled in the art that the embodiments can be modified in arrangement and detail without departing from such principles. Although, the methods and systems have been described above with reference to "repartitioning" a system initially having both software and hardware components for implementing its functionality, these methods are equally applicable for "partitioning" a system whose functionality is initially implemented entirely in software. Furthermore, the methods and systems above have been described above primarily with reference to a system bus connecting the various components of the system (e.g. FIG. 1, FIG. 3, and FIG. 6). However, other means of communication (e.g. a point-to-point connection, a network of buses etc.) are equally effective for practicing the methods and system described above.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A method for repartitioning a system design between its software components and hardware components, the method comprising:
 selecting at least one of the software components configured to implement a predetermined function of the system;
 using the selected at least one of the software components, automatically generating a representation of a hardware component corresponding to the selected at least one of the software components; and
 replacing the selected at least one of the software components with a corresponding modified software component, wherein the modified software component is generated by adapting code of the software component that the modified software component is replacing to function as a software interface that interacts with the generated representation of the hardware component so that the modified software component and the generated representation of the hardware component together implement the predetermined function of the selected at least one of the software components.

2. The method of claim 1, further comprising generating a first performance profile of the system prior to selecting the at least one of the software components.

3. The method of claim 2, further comprising using the first performance profile of the system to select the at least one of the software components.

4. The method of claim 2, wherein generating the first performance profile of the system comprises one or more of the following:

recording time data related to execution of the system;
recording memory transactions related to the execution of the system; and
recording bus transactions related to the execution of the system.

5. The method of claim 2, further comprising generating a second performance profile of the system after replacing the selected at least one of the software components with the modified software component.

6. The method of claim 5, wherein generating the second performance profile of the system comprises one or more of the following:
recording time data related to the execution of the system;
recording memory transactions related to the execution of the system; and
recording bus transactions related to the execution of the system.

7. The method of claim 5, further comprising using the second performance profile of the system to optimize performance of the system.

8. The method of claim 7, wherein optimizing the performance of the system comprises comparing the first performance profile of the system to the second performance profile of the system.

9. The method of claim 1, wherein generating the representation of the hardware component comprises generating a synthesizable HDL description of the hardware component from a programming language description of the selected at least one of the software components.

10. The method of claim 9, further comprising converting the selected at least one of the software components from a programming language description to a synthesizable programming language description prior to generating the synthesizable HDL description.

11. The method of claim 1, further comprising generating a hardware interface adapted to enable the representation of the hardware component to communicate with components of the system.

12. The method of claim 11, wherein generating the hardware interface further comprises:
providing the generated representation of the hardware component with input and output registers corresponding to input and output data of the selected at least one of the software components; and
generating address decode logic to drive the input data to the corresponding input register and retrieve the output data from the corresponding output register.

13. The method of claim 11, wherein the modified software component is adapted to use the hardware interface to pass input parameters to the representation of the hardware component and receive output data from the representation of the hardware component.

14. A tool for optimizing performance of a hardware-software system comprising:
a software execution vehicle;
a hardware execution vehicle; and
one or more processors coupled to the software execution vehicle and the hardware execution vehicle, the one or more processors programmed to replace a selected software component of the system with a corresponding modified software component and a newly generated representation of an hardware component, wherein the modified software component is generated by adapting code of the software component that the modified software component is replacing to function as a software interface to the newly generated representation of an hardware component so that the modified software component and the newly generated representation of the hardware component together achieve the same functionality as the selected software component.

15. The tool of claim 14, wherein the one or more processors are further adapted for collecting performance data of the hardware-software system.

16. The tool of claim 15, wherein the one or more processors are further programmed for generating displays of the collected performance data.

17. The tool of claim 14, further comprising a source debugger coupled to the software execution vehicle.

18. The tool of claim 14, wherein the software execution vehicle comprises FPGAs adapted to model processors executing the software components of the system.

19. The tool of claim 14, wherein the software execution vehicle comprises logic gates adapted to model processors executing the software components of the system.

20. The tool of claim 14, wherein the software execution vehicle comprises an Instruction Set Simulator adapted to model processors executing the software components of the system.

21. The tool of claim 14, wherein the hardware execution vehicle comprises logic simulators adapted to model the hardware components of the system.

22. The tool of claim 14, wherein the hardware execution vehicle comprises accelerators adapted to model the hardware components of the system.

23. The tool of claim 14, wherein the hardware execution vehicle comprises in-circuit emulators adapted to model the hardware components of the system.

24. The tool of claim 14, wherein the hardware execution vehicle comprises FPGAs adapted to model the hardware components of the system.

25. A method for optimizing performance of a hardware-software system comprising:
generating a performance profile of the hardware-software system;
using the performance profile to select a software component of the system to be converted to a hardware component;
repartitioning the hardware-software system by generating a representation of the hardware component from the selected software component;
generating a software interface to replace the software component;
generating a hardware interface that communicates between the generated representation of the hardware component and the software interface, wherein the software interface, the hardware interface and the generated representation of the hardware component together implement functionality of the software component; and
generating a performance profile of the repartitioned hardware-software system.

26. The method of claim 25, wherein generating the performance profile of the hardware-software system comprises recording data related to execution of the hardware-software system.

27. The method of claim 26, wherein the data related to execution of the hardware-software system consists of time data, memory transaction data or bus transaction data or a combination thereof.

28. The method of claim 25, wherein generating the representation of the hardware component comprises generating a synthesizable HDL description of the hardware component from a programming language description of the selected software component.

29. The method of claim 28, further comprising converting the selected software component from a programming language description to a synthesizable programming language description prior to generating the synthesizable HDL description.

30. The method of claim 29, wherein the programming language description comprises software code in C language.

31. The method of claim 25, wherein generating the software interface comprises replacing the selected software component with a modified software component, the modified software component being adapted to pass input data to the new hardware component and retrieve output data from the new hardware component.

32. The method of claim 25, wherein generating the hardware interface compnses:
providing input and output registers for the generated representation of the hardware component, the registers corresponding to input and output data of the selected software component;
generating address decode logic for driving the input data to the corresponding input registers of the generated representation of the hardware component and for retrieving the output data from the corresponding output registers of the generated representation of the hardware component.

33. The method of claim 25, wherein generating the performance profile of the repartitioned hardware-software system comprises recording data related to execution of the repartitioned hardware-software system.

34. The method of claim 33, wherein the data related to execution of the repartitioned hardware-software system consists of time data, memory transaction data or bus transaction data or a combination thereof.

35. A tool for optimizing performance of a hardware-software system having software and hardware components, the tool comprising:

a logic simulator capable of simulating the hardware components;

instruction set simulators coupled to the logic simulators and capable of emulating processors adapted to execute the software components;

memory servers capable of storing content of memory elements associated with the execution of the software components, the memory servers coupled to the memory elements and the instruction set simulators; and processors programmed to generate representations of new hardware components from selected software components and to replace the selected software components with modified software components, wherein the modified software components are generated by adapting code of the software components that the modiefied software components are replacing to function as a software interface that interacts with the generated representation of the hardware components so that the modified software components and the generated representations of the hardware components together achieve the same functionality as the selected software components.

36. The tool of claim 35, wherein the processors are further programmed to collect performance data related to execution of the software components.

37. The tool of claim 36, wherein the processors are further programmed to generate displays of the performance data.

38. The tool of claim 35, wherein the processors are further programmed to generate hardware interfaces for the generated representations of the new hardware components.

39. The tool of claim 35, wherein the instruction set simulators are annotated with time data related to the execution of the software components.

* * * * *

UNITED STATES PATENT AND TRADEMARK OFFICE
CERTIFICATE OF CORRECTION

PATENT NO.       : 7,146,581 B2
APPLICATION NO.  : 10/295538
DATED            : December 5, 2006
INVENTOR(S)      : Russell Alan Klein It is certified that error appears in the above-identified patent and that said Letters Patent is hereby corrected as shown below:

In the Specification:

Column 3, line 27, "of system" should read --of the system--.

Column 4, line 55, "processors 10" should read --processors 110--.

Column 5, line 44, "of system" should read --of the system--.

Column 6, line 39, "entirely software" should read --entirely by software--.

Column 7, line 19, "as whole" should read --as a whole--.

Column 12, line 57, "may be a generated" should read --may be generated--.

Column 13, line 3, "to identity times" should read --to identify times--.

Column 14, line 9, "Exemplary method for converting software components from a programming language to synthesizable HDL" should read as a heading --Exemplary method for converting software components from a programming language to synthesizable HDL--.

Column 14, line 56, "wWith" should read --with--.

In the Claims:

Column 17, line 62, "of an hardware" should read --of a hardware--.

Column 17, line 67, "of an hardware" should read --of a hardware--.

Column 20, line 18, "modiefied" should read --modified--.

Signed and Sealed this
Ninth Day of April, 2013

Teresa Stanek Rea
*Acting Director of the United States Patent and Trademark Office*